United States Patent [19]

Sood

[11] Patent Number: 4,467,455

[45] Date of Patent: Aug. 21, 1984

[54] BUFFER CIRCUIT

[75] Inventor: Lal C. Sood, Austin, Tex.

[73] Assignee: Motorola, Inc., Schaumburg, Ill.

[21] Appl. No.: 438,085

[22] Filed: Nov. 1, 1982

[51] Int. Cl.³ .............................................. G11C 7/00
[52] U.S. Cl. .................................... 365/189; 365/227; 365/233; 307/450
[58] Field of Search .............. 307/450, 453, 475, 583, 307/584; 365/189, 226, 227, 233

[56] References Cited

U.S. PATENT DOCUMENTS

| | | | |
|---|---|---|---|
| 4,275,312 | 6/1981 | Saito et al. | 365/227 |
| 4,337,523 | 6/1982 | Hotta et al. | 365/233 |
| 4,337,525 | 6/1982 | Akatsuka | 365/233 |
| 4,384,220 | 5/1983 | Segawa et al. | 307/450 |
| 4,385,369 | 5/1983 | Sheppard | 365/227 |
| 4,387,449 | 6/1983 | Masuda | 365/227 |

Primary Examiner—Stuart N. Hecker
Attorney, Agent, or Firm—James L. Clingan, Jr.

[57] ABSTRACT

An input buffer circuit for a memory uses two transistors interposed between a push-pull pair of transistors to control the enabling of the buffer in response to a chip write signal generated from a logical combination of chip select and write enable signals. A plurality of inverters which provide complementary signals to the push-pull transistors are disabled and prevented from using current by an interrupt transistor until the interrupt transistor receives the chip write signal.

8 Claims, 3 Drawing Figures

BUFFER CIRCUIT

BACKGROUND OF THE INVENTION

This invention relates to buffer circuits, and more particularly to clocked input buffer circuits used in memories.

Input buffer circuits for memories have been clocked primarily for the purpose of reducing power consumption. A chip select signal OVS/CS/ is provided to indicate when a particular memory chip is to be selected. When the chip is not selected, the memory is powered down to reduce power consumption in the standby mode. When the memory is in use, it is either in a read mode or a write mode as indicated by a write enable signal OVS/WE/ . It is also desirable to minimize power consumption in these modes. In the read mode the input data circuitry for the write mode is not being used so that it can be powered down. Even so there is still power being consumed by the write circuitry, in particular for MOS static random access memories (SRAMs), because of the nature of the data bus driver of the write circuitry. The data bus to be driven is for both input data in the write mode and output data in the read mode. Consequently the data bus driver for the input data must be a tri-state driver to provide a high impedance in the read mode. The data bus driver in use is a pair of insulated gate field effect transistors (IGFETs) in a push-pull arrangement. In the read mode the gates of both transistors are typically held low to provide the tri-state condition.

The bus driver itself does not cause a current drain in the read mode, but there is amplifying circuitry which does. A data input signal received on an external pin of the chip is amplified in several stages and separated into true and complementary signals. Current is drawn from the amplification stage in the read mode because both the true and complementary signals are clamped low. Natural transistors with a zero threshold voltage have been interposed between the output load device of an amplifier and the power supply to interrupt the current path in response to the write enable signal. Only a natural device can be used, otherwise there is an additional voltage drop before the signals reach the push-pull pair which cannot be tolerated. Natural devices are not always available for the design of the chip. It may be desirable to avoid the additional process complexity required to provide natural transistors in addition to depletion and enhancement transistors.

Of course in CMOS technology steady state current flow is easily avoided. For a chip where only N channel transistors are available, the considerations are substantially different than those for CMOS. U.S. Pat. No. 4,103,183, Rosenthal et al, discloses a circuit with structural similarities to the present invention but which are only superficially similar because the circuit is CMOS.

Another disadvantage of holding the inputs of the push-pull pair low is that there is some time delay in bringing an input back to a high level. For N channel transistor buffers of this type a high to low transition is faster than a low to high transition. Logic circuitry using the chip select signal OVS/CS/ and the write enable signal OVS/WE/ is required for holding both inputs low. Having such logic for each driver in a byte-wide memory is disadvantageous.

SUMMARY OF THE INVENTION

An object of this invention is to provide an improved buffer circuit.

Another object of the invention is to provide a plurality of input data buffer circuits which provide data to respective common data busses in response to a signal which is a logical combination of a chip select signal and a write enable signal.

A further object of the invention is to provide a buffer circuit which interrupts current paths to ground when a signal is at a first level and provides data to a common data bus when the signal is at a second level.

These and other objects of the invention are achieved in a memory which has a common bus for input data and output data wherein the input data is provided to the common bus when a chip select signal and a write enable signal are contemporaneously present. A generator circuit provides a chip write signal in response to contemporaneously receiving the chip select signal and the write enable signal. A buffer circuit provides input data to the common bus in response to the chip write signal. The buffer circuit has an interrupt circuit which prevents current flow in the buffer circuit until the chip write signal is received.

DETAILED DESCRIPTION OF THE DRAWINGS

Figure 1:
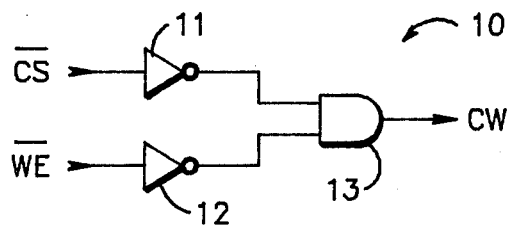
FIG. 1 is a logic diagram for generating a signal useful in a preferred embodiment of the invention.

Shown in FIG. 1 is a block diagram of a chip write signal generator 10 comprised of an inverter 11, an inverter 12, and an AND gate 13, each constructed in a conventional manner from N channel IGFETs. Inverter 11 has an input for receiving a chip select signal OVS/CS/ , and an output. Inverter 12 has an input for receiving a write enable signal OVS/WE/ , and an output. AND gate 13 has a first input connected to the output of inverter 11, a second input connected to the output of inverter 12, and an output for providing the chip write signal CW. For a typical memory chip, chip select signal OVS/CS/ is a logic low when the particular memory chip is to be selected. Write enable signal OVS/WE/ is a logic low when the write mode is to be selected. Write enable signal OVS/WE/ and chip select signal OVS/CS/ are external signals provided to the memory chip. When both are logic low the memory chip is placed in a write mode. Generator 10 provides chip write signal CW at a logic high when signals OVS/CS/ and OVS/WE/ are both logic low. Otherwise chip write signal CW is a logic low. Signal CW at a logic high consequently indicates the memory chip is selected to be in the write mode. If signal CW is a logic low, the chip is either not selected and in a standby mode or is selected to be in a read mode. Signal CW at a logic high is provided at a full power supply voltage by conventional means.

Figure 2:
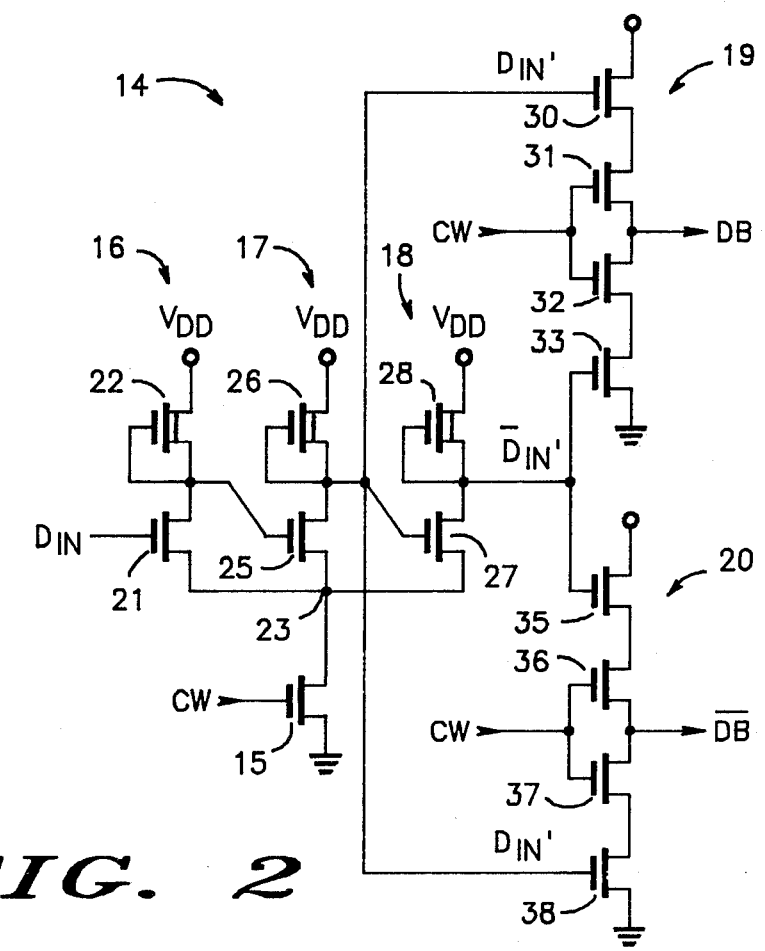
FIG. 2 is a circuit diagram of a preferred embodiment of the invention.

Shown in FIG. 2 is a buffer circuit 14 comprised generally of a current interrupt transistor 15, an inverter 16, an inverter 17, an inverter 18, a data bus driver 19, and a data bus driver 20. Buffer circuit 14 is made from N channel IGFETs which are either enhancement transistors having a threshold voltage of 0.4 to 0.6 volt or depletion transistors having a negative threshold voltage of $-3.0$ to $-4.0$ volts. Inverter 16 comprises an enhancement transistor 21 and a depletion transistor 22. Transistor 21 has a gate which operates as an input for inverter 16 and receives a data input signal $D_{IN}$, a source connected to a node 23, and a drain. Transistor 22 has a drain connected to a positive power supply terminal $V_{DD}$ for receiving a positive power supply voltage, for example 5.0 volts, and a gate and a source connected to the drain of transistor 21 to form an output node of inverter 16. Inverter 17 comprises an enhancement transistor 25 and a depletion transistor 26. Transistor 25 has a gate which operates as an input for inverter 17 and is connected to the output node of inverter 16, a source connected to node 23, and a drain. Transistor 26 has a drain connected to $V_{DD}$, and a gate and a source connected to the drain of transistor 25 to form an output node of inverter 17. Inverter 18 comprises an enhancement transistor 27 and a depletion transistor 28. Transistor 27 has a gate which operates as an input for inverter 18 and is connected to the output node of inverter 17, a source connected to node 23, and a drain. Transistor 28 has a drain connected to $V_{DD}$, and a gate and a source connected to the drain of transistor 27 to form an output node of inverter 18. Current interrupt transistor 15 is an enhancement transistor which has a drain connected to node 23, a gate for receiving signal CW, and a source connected to a negative power supply terminal for receiving current, for example, ground.

Data bus driver 19 comprises enhancement transistors 30, 31, 32 and 33. Transistor 30 has a drain connected to $V_{DD}$, a gate connected to the output node of inverter 17, and a source. Transistor 31 has a drain connected to the source of transistor 30, a gate for receiving chip write signal CW, and a source connected to a data bus DB. Transistor 32 has a drain connected to data bus DB, a gate for receiving signal CW, and a source. Transistor 33 has a drain connected to the source of transistor 32, a gate connected to the output node of inverter 18, and a source connected to ground. Data bus driver 20 comprises enhancement transistors 35, 36, 37 and 38. Transistor 35 has a drain connected to $V_{DD}$, a gate connected to the output node of inverter 18, and a source. Transistor 36 has a drain connected to the source of transistor 35, a gate for receiving signal CW, and a source connected to a data bus OVS/DB/. Transistor 37 has a drain connected to data bus OVS/DB/, a gate for receiving signal CW, and a source. Transistor 38 has a drain connected to the source of transistor 37, a gate connected to the output node of inverter 17, and a source connected to ground.

Buffer circuit 14 may be used for other purposes but for simplicity is explained in the context of an input buffer for a SRAM which provides a true and a complementary data signal on a common data bus when the memory has been selected to be in the write mode. In the write mode signal CW is a logic high which causes transistors 15, 31, 32, 36 and 37 to turn on. With transistor 15 turned on, node 23 is coupled to ground so that inverters 16, 17 and 18 operate in conventional fashion. The purpose of inverter 16 is primarily to buffer data input signal $D_{IN}$ which is an externally provided signal. Inverter 17 provides another buffer and inversion stage to provide a buffered data input signal $D_{IN}'$ which is the same logic state as that of data input signal $D_{IN}$. Inverter 18 provides another inversion to signal $D_{IN}'$ to provide buffered data input signal OVS/D/$_{IN}'$ which is complementary in logic state to signal $D_{IN}$. Assuming signal $D_{IN}$ is a logic high, signal $D_{IN}'$ is a logic high and signal OVS/D/$_{IN}'$ is a logic low. Signal $D_{IN}'$ is at essentially the same voltage as is present at $V_{DD}$ because transistor 26 is a depletion transistor acting as a resistive load which will not drop any voltage when, as in this case, there is no current flow therethrough. Signal $D_{IN}'$ turns on transistors 30 and 38. Due to the nature of IGFETs, the highest voltage transistor 30 can couple to its source is the voltage on its gate minus its threshold voltage. Consequently the voltage coupled to the drain of transistor 31 from transistor 30 is one enhancement threshold voltage down from the voltage present on $V_{DD}$. Transistor 31 has the same limitation that the highest voltage it can provide on its source is the voltage on its gate minus its threshold voltage. Because signal CW is a full power supply signal which provides the voltage present at $V_{DD}$ in logic high state, the voltage provided on the source of transistor 31 to data bus DB can be and is one enhancement threshold voltage down from the voltage on $V_{DD}$. Transistor 31 causes essentially no voltage drop in passing the voltage present on its drain to data bus DB. Signal $D_{IN}'$ also turns on transistor 38. With transistor 37 turned on, data bus OVS/DB/ is coupled to ground. Signal OVS/D/$_{IN}'$ holds transistors 33 and 35 off so that neither transistor provides a current path to adversely effect the signal present on data busses DB and OVS/DB/, respectively. Consequently a logic high is present on data bus DB and a logic low is present on data bus OVS/DB/ in response to data input signal $D_{IN}$ being a logic high.

In the case where signal $D_{IN}$ is a logic low, signal $D_{IN}'$ becomes a logic low and signal OVS/D/$_{IN}'$ becomes a logic high. Signal $D_{IN}'$ at a logic low turns off transistors 30 and 38. Signal OVS/D/$_{IN}'$ at a logic high turns on transistors 33 and 35. With transistors 33 and 32 turned on, data bus DB is coupled to ground causing a logic low to be present there. Signal OVS/D/$_{IN}'$ is a full power supply signal coupled from depletion transistor 28 acting as a resistive load. As in the case for transistors 30 and 31 when signal $D_{IN}$ is a logic high, transistors 35 and 36 couple a voltage to data bus OVS/DB/ which is one enhancement threshold down from the voltage present on $V_{DD}$. Consequently a logic high is present on data bus OVS/DB/ and a logic low is present on data bus DB in response to signal $D_{IN}$ being a logic low.

In the case where signal CW is a logic low, when the memory chip is in the read or standby mode, buffer circuit 14 is disabled. With signal CW at a logic low transistors 15, 31, 32, 36 and 37 are all turned off. Transistor 15 acts to interrupt current flow between $V_{DD}$ and ground which might flow through inverters 16–18. With transistor 15 off no power is dissipated by inverters 16–18 because no current flows therethrough. With no current path to ground available through transistors 25 and 27, both signals $D_{IN}'$ and OVS/D/$_{IN}'$ are a logic high. Even though transistors 30, 33, 35 and 38 have the voltage at $V_{DD}$ present on their respective gates, no current flows through these transistors because transistors 31, 32, 36 and 37 interrupt the flow of any such current. Transistor 31 interrupts any current flow between $V_{DD}$ and data bus DB. Transistor 33 interrupts any current flow between data bus DB and ground. Transistor 36 interrupts any current flow between $V_{DD}$ and data bus OVS/DB/. Transistor 37 interrupts any current flow between data bus OVS/DB/ and ground. With transistors 31 and 32 turned off data bus driver 19 provides a high impedance to data bus DB which is necessary in the read mode. In the read mode output data is present on data bus DB. Likewise for data bus driver 20, transistors 36 and 37 both being off ensures that data bus OVS/DB/ will see only a high impedance from driver 20 in the read mode. Consequently not only is the current through buffer circuit 14 interrupted by transistors 15, 31, 32, 36 and 37 until signal CW is a logic high, but a high impedance output on data busses DB and OVS/DB/ until signal CW is a logic high. There is an advantage in having both signals $D_{IN}'$ and OVS/D/$_{IN}'$ at a logic high in the read and standby modes because when the write mode is selected one of these signals will make a transition to a logic low while the other will remain at a logic high. Whereas, if both were a logic low, one signal would have to make the low to high transition which is slower than the high to low transition.

Figure 3:
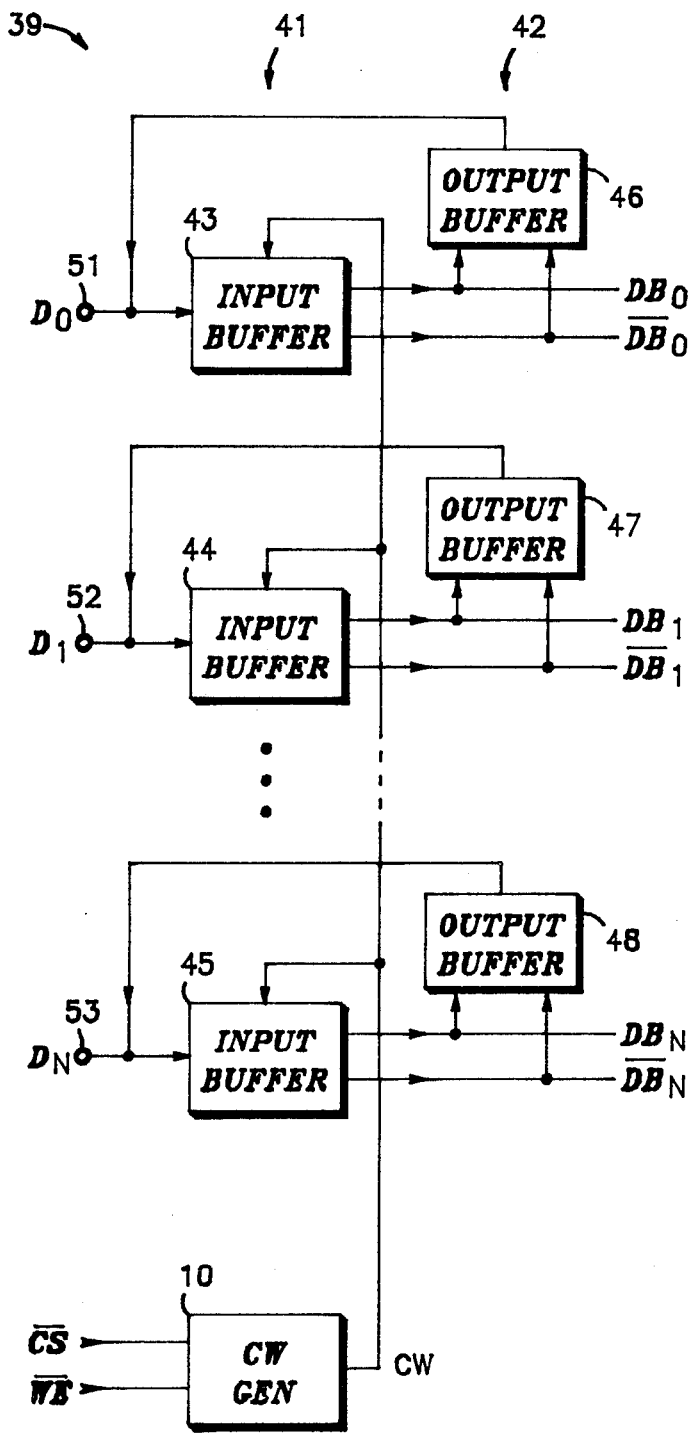
FIG. 3 is a block diagram showing use of a plurality of the circuits of FIG. 2 in an input/output circuit.

Buffer circuit 14 is advantageously used in a byte-wide SRAM which is a common configuration for a SRAM. In such a SRAM there are a plurality of data bit inputs and outputs, for example, eight. Shown in FIG. 3 is an Input/Output circuit 39 for a SRAM in block diagram form comprised generally of a plurality of data input buffers 41, a plurality of output buffers 42, and chip write signal generator 10. Plurality of input buffers 41 as shown is comprised of only three input buffers 43, 44 and 45 for simplicity. Each input buffer 43-45 is constructed as shown for buffer circuit 14 of FIG. 2. Plurality of output buffers 42 as shown is comprised of only three output buffers 46, 47 and 48 for simplicity. Output buffers 46-48 are constructed by any conventional means.

Input buffer 43 has a data input connected to an input/output (I/O) port 51, a pair of outputs connected to common data busses $DB_0$ and $\overline{DB_0}$, and a control input connected to the output of generator 10. Output buffer 46 has a pair of inputs connected to data busses $DB_0$ and $\overline{DB_0}$, and an output connected to I/O port 51. A data bit $D_0$ is either externally provided as an input on I/O port 51 to be coupled to data busses $DB_0$ and $\overline{DB_0}$ via buffer 43 or is provided as an output from data busses $DB_0$ and $\overline{DB_0}$ via output buffer 46.

Input buffer 44 has a data input connected to an I/O port 52, a pair of outputs connected to common data busses $DB_1$ and $\overline{DB_1}$, and a control input connected to the output of generator 10. Output buffer 47 has a pair of inputs connected to data busses $DB_1$ and $\overline{DB_1}$, and an output connected to I/O port 52. A data bit $D_1$ is either externally provided as an input on I/O port 52 to be coupled to data busses $DB_1$ and $\overline{DB_1}$ via buffer 44 or is provided as an output from data busses $DB_1$ and $\overline{DB_1}$ via output buffer 47.

Input buffer 45 has a data input connected to an I/O port 53, a pair of outputs connected to the data busses $DB_N$ and $\overline{DB_N}$, and a control input connected to the output of generator 10. Output buffer 48 has a pair of inputs connected to data busses $DB_N$ and $\overline{DB_N}$, and an output connected to I/O port 53. A data bit $D_N$ is either externally provided as an input provided to I/O port 52 to be coupled to data busses $DB_N$ and $\overline{DB_N}$ via input buffer 45 or is provided as an output from data busses $DB_N$ and $\overline{DB_N}$ via output buffer 48.

Generator 10 provides the only signal necessary for the control of plurality of buffer circuits 41 by providing signal CW. This is an advantage over each input buffer circuit receiving both chip select signal $\overline{CS}$ and write enable signal $\overline{WE}$. Each input buffer 43-45 is disabled when signal CW is a logic low. When signal CW is a logic high, each input buffer 43-45 couples the input signal on its I/O port to its respective pair of data busses. Each pair of data busses carries only a single bit of information, the true and complementary signal. Consequently, pair of data busses $DB_0$ and $\overline{DB_0}$, for example, can be viewed as a single data bus carrying one bit of information.

While the invention has been described in a preferred embodiment, it will be apparent to those skilled in the art that the disclosed invention may be modified in numerous ways and assume many embodiments other than that specifically set out and described above. Accordingly, it is intended by the appended claims to cover all modifications of the invention which fall within the true spirit and scope of the invention.

I claim:

1. In a memory having a common bus for input and output data wherein said data bus receives input data when a write enable signal and a chip select signal are present, the improvement comprising:
   generating means for generating a chip write signal in response to receiving the write enable signal and the chip select signal, and
   a buffer circuit for providing input data to the common bus in response to the chip write signal and providing a high impedance to the common bus until the chip write signal is received, and having interrupt means for preventing current from flowing through the buffer circuit until the chip write signal is received.

2. The memory of claim 1 wherein the buffer circuit comprises:
   first and second transistors coupled in series between a first power supply terminal and the common bus, wherein the first transistor has a control electrode for receiving a data signal and the second transistor has a control electrode for receiving the chip write signal; and
   third and fourth transistors coupled in series between a second power supply terminal and the common bus, wherein the third transistor has a control electrode for receiving the chip write signal and the fourth transistor has a control electrode for receiving a signal which is complementary to the data signal.

3. A buffer circuit having transistors all of a single conductivity type, comprising:
   first and second transistors coupled in series between a first power supply terminal and an output node, wherein the first transistor has a control electrode for receiving a data signal and the second transistor has a control electrode for receiving an enable signal; and
   third and fourth transistors coupled in series between a second power supply terminal and the output node, wherein the third transistor has a control electrode for receiving the enable signal and the fourth transistor has a control electrode for receiving a signal which is complementary to the data signal.

4. The buffer circuit of claim 3 further comprising:
   a first inverter having an input for receiving an external signal, and an output;
   a second inverter having an input coupled to the output of the first inverter, and an output for providing the data signal; and a third inverter having an input coupled to the output of the second inverter, and an output for providing the signal which is complementary to the data signal.

5. The buffer circuit of claim 4 further comprising interrupt means for interrupting current flow through the second and third inverters until the enable signal is received.

6. The buffer circuit of claim 4 further comprising:
a fifth transistor having a first current electrode coupled to a current control node, a control electrode for receiving the enable signal, and a second current electrode coupled to the second power supply terminal; and
wherein the third inverter comprises: a sixth transistor having a first current electrode coupled to the control electrode of the fourth transistor, a control electrode coupled to the output of the second inverter, and a second current electrode coupled to the current control node; and
a first load device coupled between the first power supply terminal and the first current electrode of the sixth transistor.

7. The buffer circuit of claim 6 wherein the second inverter comprises:
a seventh transistor having a first current electrode coupled to the control electrode of the first transistor, a control electrode coupled to the output of the first inverter, and a second current electrode coupled to the current control node; and
a load device coupled between the first power supply terminal and the first current electrode of the seventh transistor.

8. The buffer circuit of claim 3 wherein:
the first transistor is further characterized as having a first current electrode coupled to the first power supply terminal, and a second current electrode;
the second transistor is further characterized as having a first current electrode coupled to the second current electrode of the first transistor, and a second current electrode coupled to the output node;
the third transistor is further characterized as having a first current electrode coupled to the output node, and a second current electrode; and
the fourth transistor is further characterized as having a first current electrode coupled to the second current electrode of the third transistor, and a second current electrode coupled to the second power supply terminal.

* * * * *